United States Patent [19]

Kurtz et al.

[11] 3,868,719

[45] Feb. 25, 1975

[54] THIN RIBBON-LIKE GLASS BACKED TRANSDUCERS

[75] Inventors: Anthony D. Kurtz, Englewood; Joseph R. Mallon, Wood Ridge; Harold Bernstein, Hillsdale; Richard Alan Weber, Denville, all of N.J.

[73] Assignee: Kulite Semiconductor Products, Inc., Ridgefield, N.J.

[22] Filed: Apr. 2, 1973

[21] Appl. No.: 347,226

[52] U.S. Cl. .......................... 357/26, 357/71, 338/3, 333/72

[51] Int. Cl. ............................................ H01l 11/00

[58] Field of Search ............ 317/234; 338/3; 333/72

[56] References Cited

UNITED STATES PATENTS

| | | | |
|---|---|---|---|
| 3,469,120 | 9/1969 | Nagao et al. | 317/235 |
| 3,609,625 | 9/1971 | Watanabe et al. | 317/235 |
| 3,621,154 | 11/1971 | Kogen | 317/235 |
| 3,624,465 | 11/1971 | Moore | 317/235 |
| 3,749,984 | 7/1973 | Benyon et al. | 317/235 |
| 3,757,173 | 9/1973 | Iijima | 317/235 |

*Primary Examiner*—Michael J. Lynch
*Assistant Examiner*—E. Wojciechowicz
*Attorney, Agent, or Firm*—Arthur L. Plevy

[57] ABSTRACT

A glass or other dielectric backed transducer structure is formed by utilizing a series of processes including at least one electrostatic bond. The processes enable one to bond a semiconductor wafer to a dielectric as a glass wafer. Then by selectively removing certain conductively semiconductor, one obtains a "thin ribbon" piezoresistive bridge secured to a thin glass wafer. The resultant structure is entirely unanticipated by the prior art.

A glass part is also formed by electrostatically bonding a glass wafer to a semiconductor wafer, polishing the glass to a desired depth, masking the polished glass layer according to a desired pattern representative of the glass part, etching away all the glass except the desired pattern, and thence removing all the semiconductor.

7 Claims, 18 Drawing Figures

PATENTED FEB 25 1975 3,868,719

THIN RIBBON-LIKE GLASS BACKED TRANSDUCERS

This invention relates to the production of glass-backed transducer structures and more particularly to the production of minature glass parts and composite transducer structures.

BACKGROUND OF INVENTION

It is well known that glass is extensively used in the electronics industry as an insulator because of its dielectric constant and other good qualities. The art of glass making and the production of various parts from glass emanates from ancient times. Such techniques pre-form glass into a desired final shape or product from the liquid state, as by molding techniques and so on. There are literally hundreds of various recipes for making glass depending upon the use, nature and purpose to which the glass is used.

While glass can be machined, polished and mechanically operated on, great care has to be taken in such processes to avoid fracture or rupturing of the glass part. The problem becomes further complicated when fabricating or operating on thin, small cross-sectional glass parts.

Such glass parts as used in the electronics field may be ultra-miniature washers for electrical insulation, glass-backing plates for electrical circuits and so on. Due to the advent of integrated circuits and the general complexity of producing complicated electronic assemblies in very small packages, the desire to fabricate ultra-small glass parts is paramount. For example, in the field of transducers, which are devices for measuring pressure or force in an external environment, it is desirable to fabricate a semiconductor transducing assembly on a small glass surface to insulate the strain sensing elements from the environment. Due to the ultra-miniature size of such transducers, as piezoresistive strain gages, the glass-backing has to be both thin and small to permit the necessary insulation without losing the advantages of miniaturization.

The resultant transducer structure embodies one or more piezoresistive transducer elements mounted and securely affixed to a thin glass diaphragm (3 mils or less). The dimensions of such a piezoresistor may be in the order of 0.0002 inches thick and 0.0002 inches wide.

The glass-backed transducer can then be secured to another diaphragm as a metal or semiconductor structure or may be thusly utilized.

It is therefore an object of the present invention to provide a method of fabricating small glass parts without fear of fracture or rupturing the same.

It is a further object to provide a miniature semiconductor transducer mounted on a thin, glass-backed plate.

DESCRIPTION OF PREFERRED EMBODIMENT

A transducer assembly comprising at least a single piezoresistive element fabricated from a relatively contiguous, thin layer of silicon secured to a thin wafer of a dielectric material by means of an electrostatic bond, said transducer in one process is fabricated by treating a piece of semiconductor material to form on a surface thereof at least one piezoresistive element, polishing a corresponding surface of a dielectric wafer and electrostatically bonding said treated piece to said polished surface of said wafer with said piezoresistive element in contact with said surface and removing all of said semiconductor piece not part of said piezoresistive element.

Alternate embodiments and processes are disclosed using diffusion and photolithographic techniques.

DETAILED DESCRIPTION OF DRAWINGS

Figure 1A:
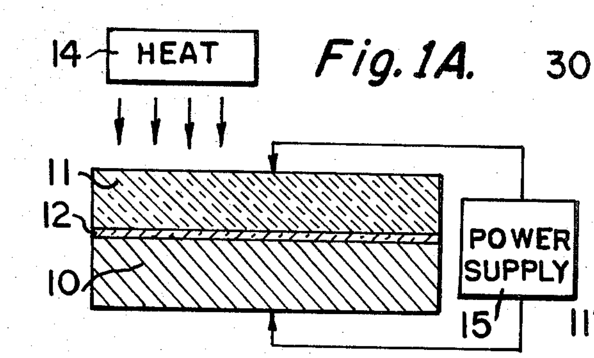
FIG. 1A is a side cross-sectional view partly in block form illustrating an electrostatic bonding technique.

FIG. 1A shows a silicon wafer 10 which is brought into close contact with a relatively large piece of glass 11.

The glass 11 may be a borosilicate glass as Pyrex Quartz or a glass which has compatible thermal characteristics with silicon, to avoid thermal streses in the cooling phase of the process to be described. The glass 11 and the silicon 10 are then heated by means of a heating assembly 14 and a bond 12 is affected between the glass and the silicon by providing small current flow through the composite assembly by means of power supply 15. The technique for bonding is sometimes referred to as anodic bonding or electrostatic bonding and reference can be made to U.S. Pat. No. 3,397,278 entitled ANODIC BONDING issued on Aug. 13, 1968 to D.I. Pomerantz and assigned to P.R. Mallory and Co., Inc.

The technique requires that the juxtaposed surfaces of the glass and silicon be relatively smooth, however, ridges or gaps will be electrostatically attracted during the application of power to the composite structure to provide a hermetic seal between the glass and the semiconductor. The heating renders the structures more conductive to permit current flow from the power source 15 to effectuate the bonding.

As indicated, the semiconductor 10 and the glass insulator possess similar thermal coefficients to reduce thermal stress and the possibility of separation during cooling. As such, silicon and Pyrex are so compatible. Pyrex is a borosilicate glass trademarked by Corning Glass Works. This glass becomes conductive at temperatures from 300°c to 700°c and can be used for element 11 of FIG. 1A.

After formation of the bond 12, the glass member 11 is thusly secured to the silicon member 10 which acts as a carrier or handle enabling one to transport and process the composite assembly with great ease and without fear of rupturing or fracturing the glass member 11. The resultant composite structure thus offers great mechanical rigidity and additional strength.

The next step in the process is to grind or polish the glass layer 11 to a desired thickness or depth and smoothness. As is known, glass can be conveniently and easily polished across the major surface thereof th a desired depth. Since the silicon 10 provides mechanical strength, there is little likelihood of rupturing the glass during this step. The silicon base member 10 is used as a "handle" to facilitate transport during the various process steps.

Figure 1B:
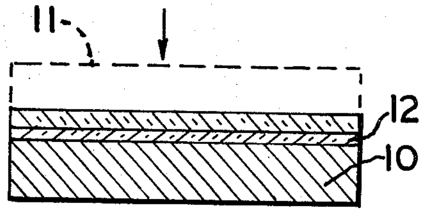
FIGS. 1B to 1E illustrate the various steps taken in forming a thin glass assembly.
Figure 1C:
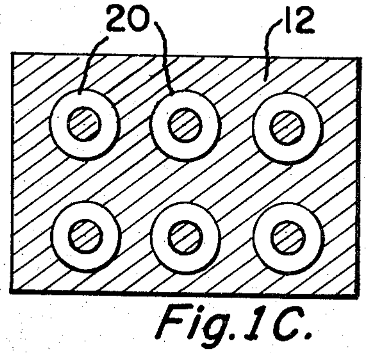

FIG. 1C shows a top view of the composite member with the glass surface facing upwards. A series of annular members 20 are located on the surface which members, for example, may be glass washers.

Figure 1D:
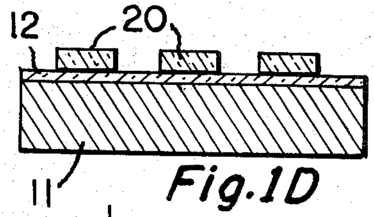

FIG. 1C and FIG. 1D involve the step of masking the glass surface 12 with a suitable mask containing geometrical structures which are to be the final glass product. As indicated, the example shows a mask for fabricating glass washers. In any event, any number of an infinite variety of glass parts can be made by using the appropriate mask and associated techniques.

Masking techniques involve a photoresist processes and chemical milling operation. In the photoresist technique, the clear areas forming the washers are treated with a material which will not be affected by the etchant to be used. This material may be chrome which is deposited over the clear areas of FIG. 1D and thus coats the glass representative of the washers 20 to be formed. The chrome will not be attacked by the etchant and can easily be removed or stripped off after the etching process. The cross-hatched areas, which are pure glass, will be etched away during this step. A suitable etchant is hydrofluoric acid or an iodine etch. These materials will remove all the glass in the cross-hatched areas while leaving all the glass in the clear areas. Furthermore, such etchants do not affect the silicon member or wafer 10. Hence, after the etch, one has the structure shown in FIG. 1D. Namely, the glass washers 20 secured to the silicon wafer 10 via the anodic bond 12.

The silicon base member 10 can now be etched away by the use of a suitable etch such as hydrazine, which is an acid that attacks silicon and not glass. It is also noted that the bond 12 will also be removed, as for all practical purposes the bond is so thin as to be practically non-existant. As indicated in the above noted patent, measurements made on such bonds indicate a bonding region 12 which extends to a depth in the order of 20 to 200 angstrom.

Figure 1E:
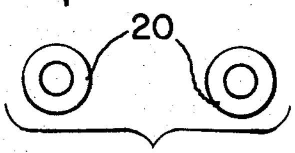

After the silicon is etched away, one has a plurality of glass washers 20 (FIG. 1E), each of which may be of the order of mils in diameter and fractions of mils thick or, of course, they can be larger. It is also obvious that any other glass part of practically any dimension can be fabricated by the use of this process.

It is also seen that the final glass part can again be electrostatically or anodically bonded to a metal or insulator if desired by repeating the step shown in FIG. 1A using the glass part 20 in lieu of piece 11.

As indicated above, it is desirable to provide a transducer which is fabricated on a glass backplate. Use of an integral glass-backed transducer allows the fabrication of fine geometry semiconductors as well as easier lead attachment.

The following techniques are applicable:

The first step in this process is again shown in FIG. 1A. By using the above described electrostatic or anodic bonding technique, a glass wafer 11 is bonded to a silicon base meber 10.

While it may be preferable in certain instances to commence the process with the bonding of a thin glass wafer 11 to a silicon base meber 10, as described, it is in fact not necessary in every case.

For example, if a thin wafer of glass is desired, one can provide this silicon base member 11 as a handle. Alternatively, one can start the process with a thicker piece of glass, which would be mechanically rigid and relatively immune to cracking or fracture.

A suitable surface of the glass wafer can then be polished and a treated silicon wafer can thus be secured directly to the glass without an additional silicon base member as 11.

The glass wafer is then milled, polished or ground to a desired height as in FIG. 1B to form at a surface thereof a good optical flat.

Figures 2B, 2C:
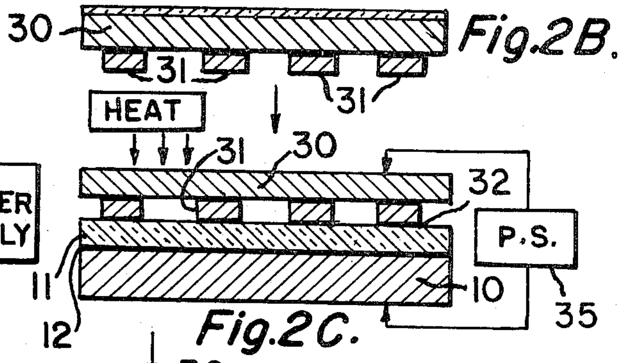
FIGS. 2B to 2G illustrate the various steps in forming a glass-backed transducer according to a photolithographic technique.

Referring to FIG. 2B, a processed silicon wafer 30 is shown having raised areas 31 containing preformed strain gage patterns. The wafer is a monolithic body of silicon or other semiconductor as 30. The piezoresistors 31 are p type members or n type silicon members of p or n type germanium or other piezoresistive semiconductor materials.

Photolithographic techniques operate with a coating of silicon dioxide which is formed on the silicon wafer. The oxide is then preferentially removed by spreading a uniform photosensitive film over the oxide, masking portions of the film and exposing the assembly to ultraviolet radiation. The exposed portion of the film becomes insoluble, whereas the masked portion is soluble in a developing film. The oxide in those areas where the film has been removed can now be removed by etching in hydrofluoric acid, thus providing openings in the oxide layer where elements 31 as piezoresistive strain sensors can be chemically milled using an etch which attacks silicon but not silicon dioxide. The piezoresistive elements 31 are raised above the surface of the silicon wafer 30.

For examples of techniques for the production of such transducing assemblies, reference may be had to a publication entitled THEORETICAL NOTES ON THE DESIGN OF INTEGRATED SENSOR FOR USE IN MINATURE PRESSURE TRANSDUCERS, published as Application Note KPS-An10 by Kulite Semiconductor Products, Inc., the assignee herein.

The composite structure is then positioned on top of the glass layer 11 which may include a silicon base member 10 electrostatically bonded thereto or may not as above described. The assembly is positioned with the piezoresistors 31 contacting the glass wafer 11. Heat is applied, as described, and a current is applied via power supply 35. The influence of the heat current causes the member 30 to be electrostatically bonded to the glass wafer 11 via bonds 32.

Figure 2D:
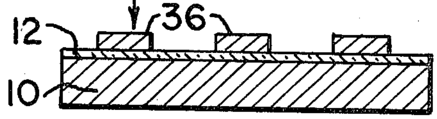

Thus, FIG. 2D shows the ribbon-like piezoresistors 31 bonded to a glass wafer 11 by means of an electrostatic bond 32.

Figures 2E, 2F, 2G:
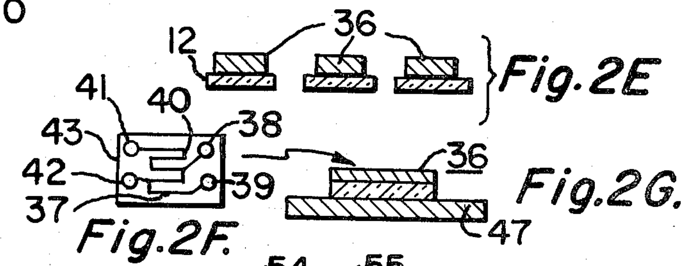

If the silicon handle 10 is utilized, it can be etched away as shown in FIG. 2E.

Individual transducers can be formed by cutting or scribing or by other means separating he glass wafer into separate transducer assemblies 36 as shown in FIG. 2E. Each element is fixed and secured to a thin glass plate or wafer 12.

FIG. 2F shows a top view of an individual transducer 36 with piezoresistors 37 and 40 mounted thereon. Also shown are terminal areas 38, 39, 41 and 42. The terminals are metal as aluminum and so on, which can be evaporated on the wafer or otherwise deposited during one of the above steps in the process or later if desired.

The glass-backed transducer 36 can then be further secured to a metal force collector or diaphragm 47 as shown in FIG. 2G. This can be accomplished by another electrostatic bonding step as shown in FIGS. 1A and 2C for example, or can be implemented by an epoxy bond or other wise.

In any event, the assembly shown in FIG. 2F is entirely unique in the transducer field. The assembly 36 is a "ribbon-like" configuration of one or more piezoresistors secured directly to a thin glass structure. The glass may be on the order of 3 mils or less in thickness, while the elements as 37 and 40 may be about 0.015 inches long or longer 0.001 inches wide and 0.0003 inches thick.

Figure 3A:
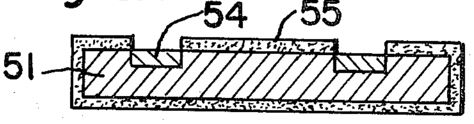
FIGS. 3A to 3F illustrate the various steps taken in forming a glass-backed transducer according to an alternate series of processes.

Referring to FIGS. 3Aa to 3G, there is shown another series of processes for fabricating dielectric backed transducer assemblies.

Figure 3B:
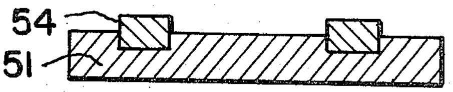
Figure 3C:
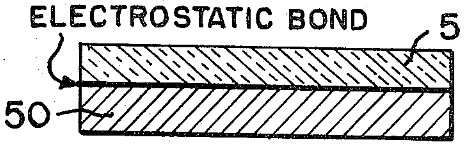
Figure 3D:
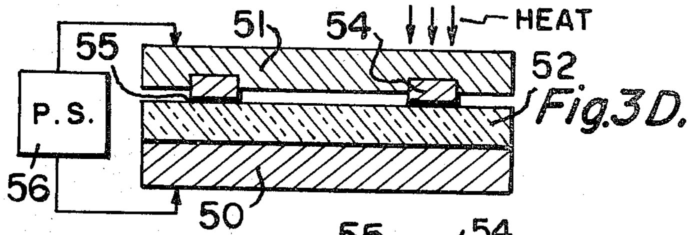
Figure 3E:
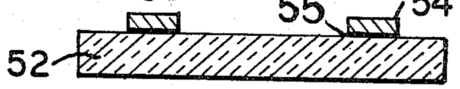

First referring to FIG. 3C, there is shown a silicon handle or carrier member 50 which has been electrostatically bonded to a dielectric wafer 52 as glass. The electrostatic bonding technique utilized is that technique as shown in FIG. 1A for example. At this point it is interesting to note that glass-backed transducers are preferable for many reasons, which are all associated with the good dielectric properties of glass. In any event, the dielectric could also include quartz, saphire, spinel or similar dielectrics, all of which will function with electrostatic bonding.

It is also again noted that the silicon handle assembly, while convenient, need not be included as above indicated and the desired structure can be directly bonded to a glass or other dielectric substrate of a suitable thickness dimension. These dielectrics are capable of withstanding higher temperatures than a typical glass substrate and therefore permit a higher temperature range to be accommodated during the processing techniques or during the operation of the resultant transducer assembly.

Referring now to FIG. 3A, there is shown a silicon wafer 51 of n type conductivity. The wafer 51 has a layer of silicon dioxide 55 thermally grown on the surfaces thereof. The $S_iO_2$ layer 55 is opened by an etching technique in predesired areas and piezoresistive elements 54, p type, are diffused therein. The silicon dioxide layer is removed as shown in FIG. 3B by hydrofluoric acid in conjunction with a photolithographic technique. The diffusion process for forming the piezoresistors 54 is known and reference can be made to the above noted application bulletin, for examples of such techniques.

After diffusion of the piezoresistors 54, the surface surrounding the elements 54 is slightly depressed with respect to the main surface of silicon wafer 51.

The depressed areas are etched (FIG. 3B) by a selective etching technique so that the piezoresistors are above the surface of wafer 50 as shown, greatly exaggerated in FIG. 3B.

In any event, the n type wafer 51 has chemically milled, utilizing photolithographic techniques, raised p type piezoresistors 54. Since the photolithographic process is capable of good control, each raised piezoresistor 54 area is approximately of the same height, which may be, for example, 0.0003 inches or less.

The formation of p type and n type regions within a single crystal of semiconductor material as silicon facilitates the fabrication of fine geometries since they may be chemically milled using an etch which attacks p type areas but not n areas or vice versa. In using such techniques, a typical piezoresistor 54 may be approximately 0.015 inches long by 0.001 inches wide and 0.0003 inches thick. The pattern is approximately U shaped and hence, as one can ascertain, is extremely small.

Figure 3F:
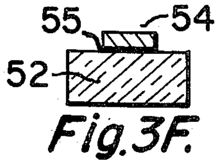
Figure 3G:
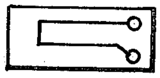

The structure of FIG. 3B is now placed in contact with the surface of the dielectric as the glass 52 surface. This surface as previously described is polished and so on in order to permit good bonding thereto. The elements 54 contact the surface and are held in contact, heat is applied (FIG. 3B) and a current from power source 56 causes an electrostatic bond 55 to form, thus securing the surface of piezoresistors 54 to the surface of the dielectric wafer 52. The handle member 50, if utilized, can be etched away to provide the structure shown in FIG. 3F, namely, a thin-line piezoresistor 54 bonded by means of an electrostatic bond 55 to a dielectric substrate 52. Using diffusion techniques, the piezoresistor 54 may be about 0.015 inches long, 0.0002 inches wide and 0.0002 inches thick, thus defining an even smaller assembly. The dielectric wafer 52 can be scribed, sawed or cut to form individual transducers as shown in FIG. 3G, as a side elevational and top view.

Terminals can be added at suitable steps in the process or can be deposited later on.

Other modifications, embodiments and uses will become apparent to those skilled in the art as how to fabricate additional dielectric backed transducers of various geometrical configurations and structures without departing from the scope and breath of this invention as defined within the bounds of the claims appended hereto.

What is claimed is:

1. A pressure transducer assembly comprising:

a. a piezoresistive element fabricated from a bulk, contiguous, thin ribbon-like layer of silicon, said thin layer being of a "U" shaped configuration, b. a thin diaphragm fabricated from a dielectric material having a relatively smooth surface and a bond between said smooth surface of said thin diaphragm and said piezoresistive element to secure said thin layer of silicon to said thin diaphragm, to thereby form a composite pressure transducer, said bond characterized in that the same includes a glass of the type capable of conducting current at a temperature above 300°C, said bond being between 20 to 200 angstroms thick; and c. terminal means positioned on said diaphragm and electrically connected to said piezoresistive element, whereby pressure measurements can be monitored.

2. The transducer assembly according to claim 1 wherein said thin wafer is fabricated from a borosilicate glass.

3. The transducer assembly according to claim 1 wherein said piezoresistive element is between 0.001 and 0.0001 inches wide and less than 0.0005 inches thick.

4. The transducer assembly according to claim 1 wherein said thin wafer is fabricated from quartz.

5. The transducer assembly according to claim 1 wherein said thin wafer is fabricated from saphire.

6. The transducer assembly according to claim 1 wherein said thin wafer is fabricated from spinel.

7. A pressure transducer apparatus, comprising:

a. a thin "U" shaped ribbon-like member of silicon fabricated from a single piece of silicon having a piezoresistive effect whereby a change of resistance is afforded by a pressure applied to said element, b. a diaphragm member fabricated from a thin layer of glass and having a smooth top surface, c. a glass bond securing said thin "U" shaped member to said diaphragm member, said bond having a thickness in the range between 20 to 200 angstrom units and formed from a glass of the type which conducts current at an elevated temperature in excess of 300°C.; ; and d. terminal means positioned on said diaphragm and electrically connected to said piezoresistive element, whereby pressure measurements can be monitored.

* * * * *